(12) United States Patent
Fujimaki et al.

(10) Patent No.: US 10,312,471 B2
(45) Date of Patent: Jun. 4, 2019

(54) METHOD OF MANUFACTURING DISPLAY DEVICE, DISPLAY DEVICE, AND ELECTRONIC DEVICE

(71) Applicant: Sony Corporation, Tokyo (JP)

(72) Inventors: Hiroshi Fujimaki, Kanagawa (JP); Tomoyoshi Ichikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/561,705

(22) PCT Filed: Mar. 4, 2016

(86) PCT No.: PCT/JP2016/056757
§ 371 (c)(1),
(2) Date: Sep. 26, 2017

(87) PCT Pub. No.: WO2016/170856
PCT Pub. Date: Oct. 27, 2016

(65) Prior Publication Data
US 2018/0097201 A1 Apr. 5, 2018

(30) Foreign Application Priority Data
Apr. 22, 2015 (JP) .................. 2015-087580

(51) Int. Cl.
*H01L 51/52* (2006.01)
*H01L 51/56* (2006.01)
(Continued)

(52) U.S. Cl.
CPC ...... *H01L 51/5259* (2013.01); *H01L 27/3216* (2013.01); *H01L 27/3218* (2013.01);
(Continued)

(58) Field of Classification Search
CPC .............. H01L 51/56; H01L 51/5259; H01L 51/50–51/5296; H01L 27/32
See application file for complete search history.

(56) References Cited

U.S. PATENT DOCUMENTS

| 6,812,637 B2* | 11/2004 | Cok ................... H01L 51/5206 313/503 |
| 2012/0070942 A1* | 3/2012 | Fedorovskaya ....... C23C 16/403 438/127 |
| 2014/0061595 A1* | 3/2014 | Kim ................... H01L 27/3244 257/40 |

FOREIGN PATENT DOCUMENTS

| JP | 2006-201421 A | 8/2006 |
| JP | 2008-238195 A | 10/2008 |

(Continued)

OTHER PUBLICATIONS

Ito, Y. "Fabrication of Oled display by an ultrashort laser: selective patterning of thin metal electrode" Proc. SPIE 6458, Photon Processing in Microelectronics and Photonics VI, 64580C dated Mar. 13, 2007 pp. 64580C-1-64580C-8.*

Primary Examiner — Matthew C Landau
Assistant Examiner — Grant S Withers
(74) Attorney, Agent, or Firm — Michael Best & Friedrich LLP

(57) ABSTRACT

A method of manufacturing a display device including first electrodes provided for respective pixels, an insulating layer having openings respectively opposed to the first electrodes, an organic layer including a light emitting layer common to all the pixels, and a second electrode formed over an entire surface of the organic layer laminated on a first substrate, includes a step of forming an auxiliary wiring made of a metallic material layer by irradiating the metallic material layer with energy rays from a side of the metallic material layer and selectively removing the metallic material layer by (Continued)

energy absorbed by a part corresponding to the pixel after the metallic material layer has been formed on an entire surface of the second electrode.

7 Claims, 17 Drawing Sheets

(51) Int. Cl.
*H01L 27/32* (2006.01)
*H01L 51/00* (2006.01)

(52) U.S. Cl.
CPC ...... *H01L 27/3279* (2013.01); *H01L 51/0023* (2013.01); *H01L 51/5203* (2013.01); *H01L 51/5209* (2013.01); *H01L 51/5228* (2013.01); *H01L 51/5246* (2013.01); *H01L 51/5275* (2013.01); *H01L 51/56* (2013.01); *H01L 27/322* (2013.01); *H01L 2251/5315* (2013.01); *H01L 2251/5361* (2013.01)

(56) References Cited

FOREIGN PATENT DOCUMENTS

| | | | |
|---|---|---|---|
| JP | 2009-533810 | A | 9/2009 |
| JP | 2010-541159 | A | 12/2010 |
| JP | 2011-232764 | A | 11/2011 |
| JP | 2014-026725 | A | 2/2014 |
| WO | 2015/008431 | A1 | 1/2015 |

\* cited by examiner

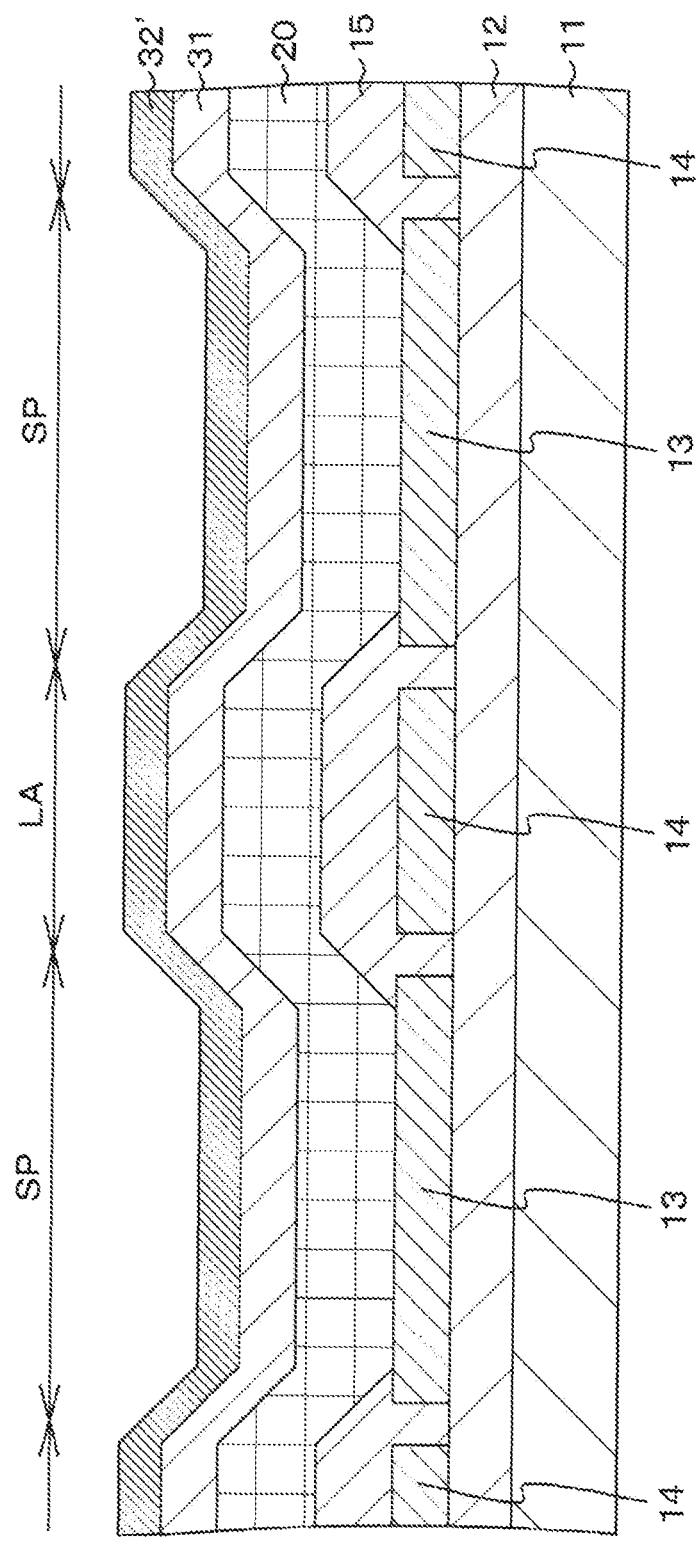

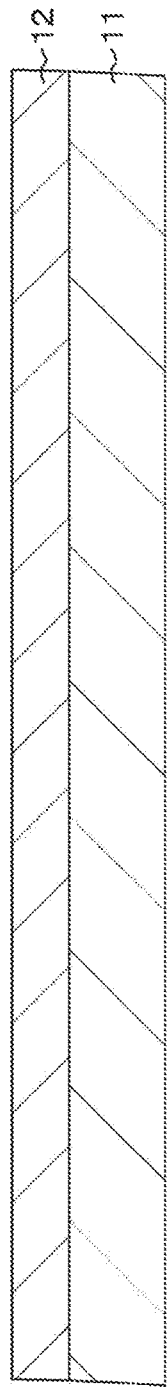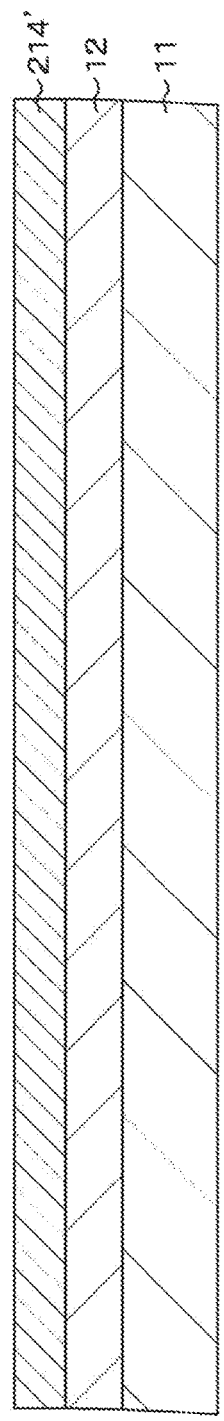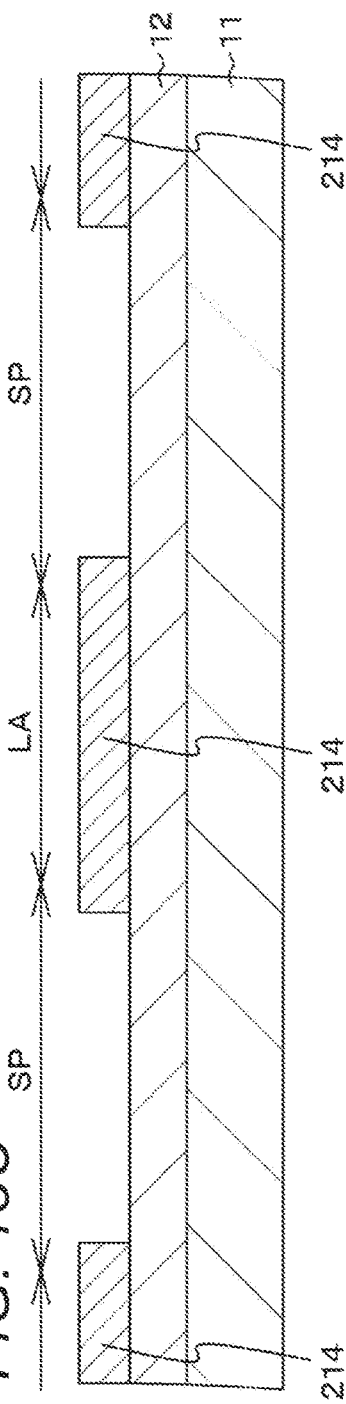

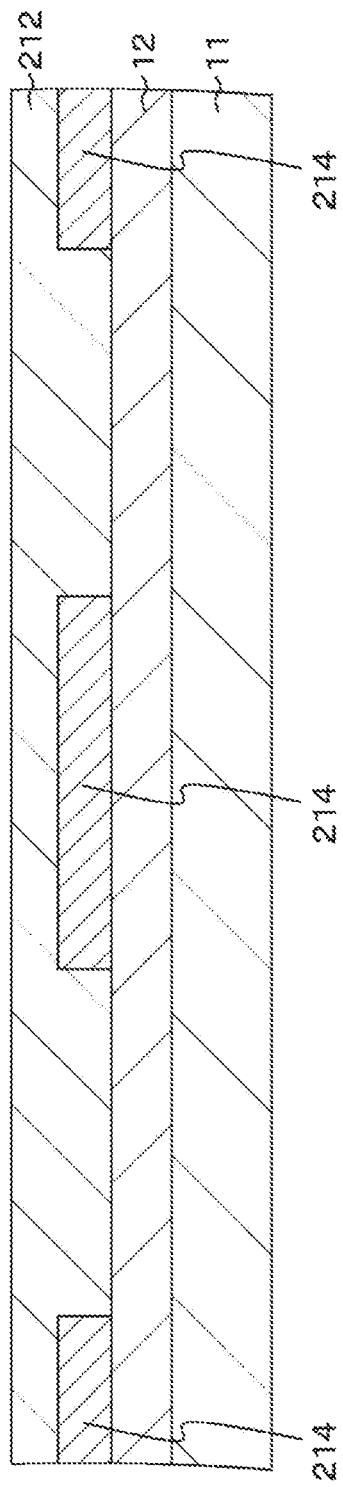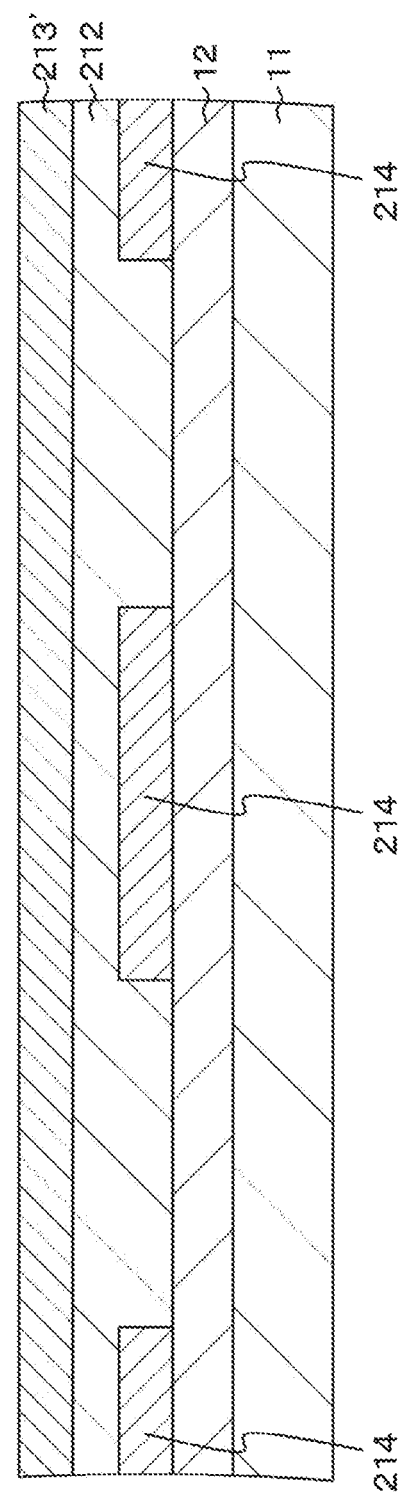

METHOD OF MANUFACTURING DISPLAY DEVICE, DISPLAY DEVICE, AND ELECTRONIC DEVICE

TECHNICAL FIELD

The present disclosure relates to a method of manufacturing a display device, a display device, and an electronic device. More specifically, the present disclosure relates to a method of manufacturing a display device used for a microdisplay for requiring a pixel pitch of several microns, a display device, and an electronic device including the display device.

BACKGROUND ART

As a display device for displaying an image, development of an organic electroluminescence display device using an organic electroluminescence element as a display element has been advanced. Furthermore, the organic electroluminescence display device is used for not only a direct view type display but also a microdisplay for requiring a pixel pitch of several microns. In the following description, there is a case where the organic electroluminescence element is abbreviated as an "organic EL element" and the organic electroluminescence display device is abbreviated as an "organic EL display device".

In the direct-viewing type organic EL display device, normally, a red light emitting unit, a green light emitting unit, a blue light emitting unit, and the like are selectively coated by a mask vapor deposition process or the like. However, it is difficult to selectively apply the coating in the organic EL display device used for the microdisplay since mask positioning accuracy and the like is required. Therefore, the red, green and blue light emitting layers are laminated over the entire display region to obtain white color, and colorization is performed by using a color filter.

Furthermore, in an organic EL display device having a so-called top emission structure, it is necessary for an upper electrode to be configured to transmit light. Therefore, it is necessary to form the upper electrode by using a transparent conductive material such as ITO or IZO. However, since a sheet resistance of the transparent electrode becomes relatively higher than that of an electrode made of a metal material such as aluminum, a problem such as reduction in image quality caused by a voltage drop or the like may occur. If the film thickness of the transparent electrode is increased, the sheet resistance can be lowered. However, a problem such as reduction in transmittance occurs.

Therefore, to substantially lower the sheet resistance of the transparent electrode, an auxiliary wiring is provided separately from the transparent electrode. For example, Patent Document 1 discloses that an auxiliary wiring is provided on a substrate side opposed to a substrate on which a transparent electrode is provided, and the auxiliary wiring and the transparent electrode are connected by a contact. Furthermore, Patent Document 2 discloses that an auxiliary wiring is formed to be superposed on a transparent electrode.

CITATION LIST

Patent Document

Patent Document 1: Japanese Patent Application Laid-Open No. 2006-201421

Patent Document 2: Japanese Patent Application Laid-Open No. 2011-232764

SUMMARY OF THE INVENTION

Problems to be Solved by the Invention

As described above, the organic EL display device for the microdisplay has a configuration in which the red, green, and blue light emitting layers are laminated over the entire display region. Therefore, since it is difficult to form an insulating layer that electrically insulates the light emitting layer from the contact, the auxiliary wiring is hardly provided on the opposed substrate. Therefore, to substantially lower the sheet resistance of the transparent electrode, it is necessary to form the auxiliary wiring to be superposed on the transparent electrode.

However, in the organic EL display device for the microdisplay, it is necessary to form the auxiliary wiring to be superposed on the transparent electrode with high accuracy. Therefore, a method and a structure suitable for forming the auxiliary wiring to be superposed on the transparent electrode with high accuracy have been required.

Accordingly, an object of the present disclosure is to provide a method of manufacturing a display device capable of forming an auxiliary wiring to be superposed on a transparent electrode with high accuracy, and a display device in which an auxiliary wiring is formed with high accuracy to be superposed on a transparent electrode.

Solutions to Problems

A method of manufacturing a display device according to a first aspect of the present disclosure to achieve the object is a method of manufacturing a display device including first electrodes provided for respective pixels, an insulating layer having openings respectively opposed to the first electrodes, an organic layer including a light emitting layer common to all the pixels, and a second electrode formed over an entire surface of the organic layer laminated on a first substrate, and the method includes a step of forming an auxiliary wiring made of a metallic material layer by irradiating the metallic material layer with energy rays from a side of the metallic material layer and selectively removing the metallic material layer by energy absorbed by a part corresponding to the pixel after the metallic material layer has been formed on an entire surface of the second electrode.

A display device according to the first aspect of the present disclosure to achieve the object is a display device including first electrodes provided for respective pixels, an insulating layer having openings respectively opposed to the first electrodes, an organic layer including a light emitting layer common to all the pixels, and a second electrode formed over an entire surface of the organic layer laminated on a first substrate, and a part corresponding to the pixel is configured to form a resonance structure for absorbing energy rays between a reflective surface on a side of the first substrate and a reflective surface on the second electrode when it is assumed that the reflective surface be formed on the second electrode.

An electronic device according to the first aspect of the present disclosure to achieve the object is an electronic device including a display device, and the display device includes first electrodes provided for respective pixels, an insulating layer having openings respectively opposed to the first electrodes, an organic layer including a light emitting layer common to all the pixels, and a second electrode formed over an entire surface of the organic layer laminated on a first substrate. A part corresponding to the pixel is configured to form a resonance structure for absorbing energy rays between a reflective surface on a side of the first substrate and a reflective surface on the second electrode when it is assumed that the reflective surface be formed on the second electrode.

Effects of the Invention

In the method of manufacturing the display device according to the present disclosure, after the metallic material layer has been formed on the entire surface of the second electrode, the metallic material layer is irradiated with energy rays from the side of the metallic material layer, and the metallic material layer is selectively removed by the energy absorbed by the part corresponding to the pixel. In this way, the auxiliary wiring made of the metallic material layer is formed. Accordingly, the auxiliary wiring can be formed with high accuracy with a simple method of irradiating the metallic material layer with the energy rays from the side of the metallic material layer. Note that the effects described herein are only exemplary and not limited. In addition, there may be an additional effect.

BRIEF DESCRIPTION OF DRAWINGS

FIG. 6 is continued from FIG. 5B and is a schematic partial cross-sectional diagram of the first substrate and the like to describe the method of manufacturing the display device according to the first embodiment

FIGS. 13A to 13C are schematic partial cross-sectional diagrams of a first substrate and the like to describe a method of manufacturing the display device according to the second embodiment.

FIGS. 14A and 14B are continued from FIG. 13C and are schematic partial cross-sectional diagrams of the first substrate and the like to describe the method of manufacturing the display device according to the second embodiment FIG. 16A is a front view of the digital still camera, and FIG. 16B is a rear view.

MODE FOR CARRYING OUT THE INVENTION

Figure 1:
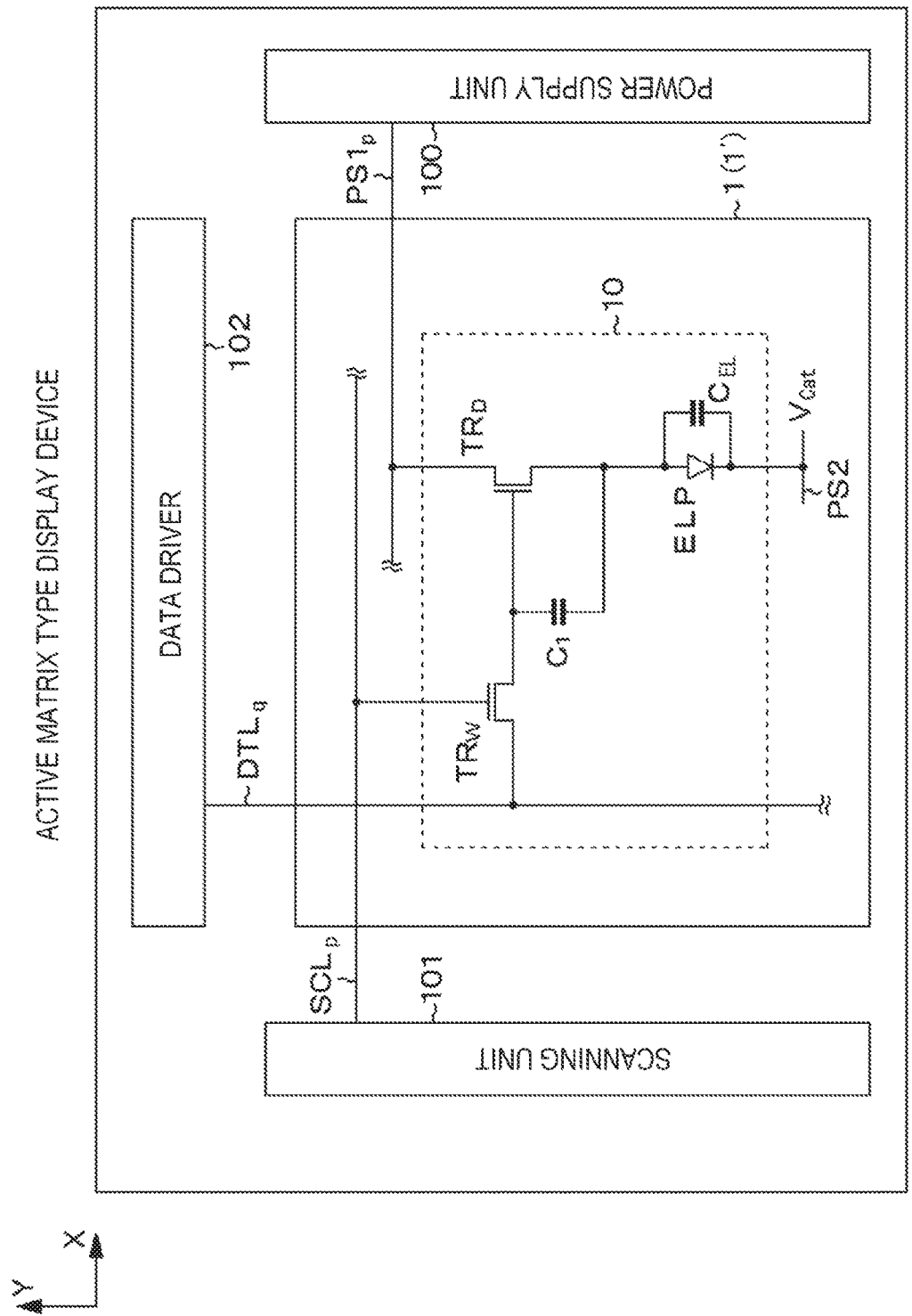
FIG. 1 is a system configuration diagram of an outline of a basic configuration of an active matrix type organic EL display device which is a premise of the present disclosure.

Hereinafter, the present disclosure is described on the basis of embodiments with reference to the drawings. The present disclosure is not limited to the embodiments, and various values and materials in the embodiments are only exemplary. In the following description, the same elements or elements having the same functions are denoted with the same reference numerals, and overlapped description is omitted. Note that the description will be made in the following order.

1. General description on method of manufacturing display device, display device, and electronic device according to the present disclosure 2. Active matrix type organic EL display device as the premise of the present disclosure 3. First Embodiment 4. Second Embodiment 5. Application example (example of electronic device), others General description on method of manufacturing display device, display device, and electronic device according to the present disclosure In a method of manufacturing a display device according to the present disclosure, it is possible that a part corresponding to a pixel is configured to form a resonance structure for absorbing energy rays between a reflective surface on the side of a first substrate and a reflective surface formed of a metallic material layer on a second electrode. In this case, for example, a first electrode can be made of a metal material, and the reflective surface on the side of the first substrate can be formed of the surface of the first electrode. Alternatively, the first electrode is made of a transparent conductive material and the reflective surface on the side of the first substrate is formed of a surface of a reflective electrode provided separately from the first electrode. This is similarly applied to a display device and an electronic device according to the present disclosure. Note that a potential of the reflective electrode may be regulated or not. For example, the reflective electrode may electrically float with respect to the first electrode.

In the method of manufacturing a display device according to the present disclosure including the preferred configurations, it is possible that a part between the adjacent pixels is configured to form a resonance structure for reflecting the energy rays between the reflective surface on the side of the first substrate and the reflective surface formed of the metallic material layer on the second electrode. In this case, a form can be used in which the reflective surface on the side of the first substrate in the part between the adjacent pixels is formed of the surface of a reflection plate provided on the first substrate in the part between the adjacent pixels. The reflection plate may be formed as the same layer as the first electrode or may be formed as a separate layer.

In the method of manufacturing a display device according to the present disclosure including the preferred configurations, it is desirable that the energy ray be a laser beam, more preferably, a laser beam in an infrared region. A laser light source is not particularly limited, and various lasers such as a solid-state laser, a gas laser, a semiconductor laser, and a liquid laser can be used. For example, in a case where a Nd: YAG laser is used, the wavelength is 1064 nm.

In the display device according to the present disclosure, it is possible that the part between the adjacent pixels is configured to form the resonance structure for reflecting the energy rays between the reflective surface on the side of the first substrate and the reflective surface on the second electrode when it is assumed that the reflective surface is formed on the second electrode. In this case, a form can be used in which the reflective surface on the side of the first substrate in the part between the adjacent pixels is formed of the surface of the reflection plate provided on the first substrate in the part between the adjacent pixels. The reflection plate may be formed as the same layer as the first electrode or may be formed as a separate layer. This is similarly applied to the electronic device according to the present disclosure.

Active matrix type organic EL display device as the premise of the present disclosure FIG. 1 is a system configuration diagram of an outline of a basic configuration of an active matrix type organic EL display device which is a premise of the present disclosure.

The active matrix type organic EL display device is a display device which drives a light emitting unit by an active element provided in the same pixel as the light emitting unit, for example, an insulated gate field-effect transistor. For convenience of illustration, in FIG. 1, a connection relationship of a single display element 10, more specifically, the (q, p)-th display element 10 described later is illustrated.

In the active matrix type organic EL display device includes a display device 1 and a data driver 102 for applying a voltage to a data line DTL. The display device 1 includes the display elements 10, each including a current driven type light emitting unit and a driving circuit for driving the light emitting unit, arranged in a two-dimensional matrix form in a state where the display element 10 is connected to a scanning line SCL extending in the row direction (X direction in FIG. 1) and the data line DTL extending in the column direction (Y direction in FIG. 1). A scanning unit 101 supplies a scanning signal to the scanning line SCL. A light emitting unit ELP included in the display element 10 is formed of an organic electroluminescence light emitting unit.

The display device 1 further includes a feeder line PS1 connected to the display elements 10 arranged in the row direction and a second feeder line PS2 commonly connected to all the display elements 10. A power supply unit 100 supplies a predetermined drive voltage to the feeder line PS1. A common voltage (for example, ground potential) is supplied to the second feeder line PS2.

Although not illustrated in FIG. 1, a region (display region) where the display device 1 displays an image includes Q×P display elements 10 in total arranged in a two-dimensional matrix. That is, in the two-dimensional matrix, Q display elements 10 are arranged in the row direction, and P display elements 10 are arranged in the column direction. The number of rows of the display elements 10 in the display region is P, and the number of the display elements 10 included in each row is Q.

Furthermore, the number of the scanning lines SCL and the number of the feeder lines PS1 are P. The display elements 10 in the p-th row (p=1, 2, . . . , P) are connected to the p-th scanning line $SCL_p$ and the p-th feeder line $PS1_p$, and form a single display element row. Note that, in FIG. 1, the feeder line $PS1_p$ is illustrated.

Furthermore, the number of the data lines DTL is Q. The display elements 10 in the q-th column (q=1, 2, . . . , Q) are connected to the q-th data line $DTL_q$. Note that, in FIG. 1, the data line $DTL_q$ is illustrated.

The display device 1 is, for example, a color display device, and a single display element 10 forms a single pixel. Although not illustrated, the single pixel includes a combination of a pixel for displaying red, a pixel for displaying green, and a pixel for displaying blue arranged in the row direction. Therefore, the display device 1 has Q/3 pixels in the row direction and P pixels in the column direction. In addition to U-XGA (1600, 1200), HD-TV (1920, 1080), Q-XGA (2048, 1536), some image display resolutions, such as (3840, 2160) and (7680, 4320), can be exemplified as the pixel value. However, the pixel value is not limited to these.

In accordance with the scanning signal from the scanning unit 101, the display device 1 is sequentially line-scanned row by row. The display element 10 positioned at the p-th row and the q-th column is referred to as a (q, p)-th display element 10 or a (q, p)-th pixel below.

In the display device 1, the display elements 10 configuring each of the Q pixels arranged in the p-th row are concurrently driven. In other words, the timing of light emission/no light emission of the Q display elements 10 arranged along the row direction is controlled in units of rows to which the display elements 10 belong. If a display frame rate of the display device 1 is expressed as FR (times/sec), a scanning period per row when the display device 1 is sequentially line-scanned row by row (so-called horizontal scanning period) is shorter than (1/FR)×(1/P) seconds.

For example, a device which is not shown inputs a gradation signal $D_{Sig}$ corresponding to an image to be displayed to the data driver 102. There is a case where a gradation signal corresponding to the (q, p)-th display element 10 of the input gradation signal $D_{Sig}$ is expressed as $D_{Sig(q,p)}$.

The display element 10 includes at least the current driving type light emitting unit ELP, a writing transistor $TR_W$, a driving transistor $TR_D$, and a capacitor $C_1$. When a current flows through the light emitting unit ELP via a source/drain region of the driving transistor $TR_D$, the display element 10 emits light.

The capacitor $C_1$ is used to hold a voltage of a gate electrode with respect to the source region (so-called gate-source voltage) of the driving transistor $TR_D$. When the display element 10 is emitting light, one source/drain region (side connected to feeder line PS1 in FIG. 1) of the driving transistor $TR_D$ serves as a drain region, and the other source/drain region (one end of light emitting unit ELP, specifically, side connected to anode electrode) serves as a source region. One electrode and the other electrode forming the capacitor $C_1$ are respectively connected to the other source/drain region and the gate electrode of the driving transistor $TR_D$.

The writing transistor $TR_W$ includes a gate electrode connected to the scanning line $SCL_q$, one source/drain region connected to the data line $DTL_q$, and the other source/drain region connected to the gate electrode of the driving transistor $TR_D$.

The gate electrode of the driving transistor $TR_D$ is connected to the other source/drain region of the writing transistor $TR_W$ and the other electrode of the capacitor $C_1$, and the other source/drain region of the driving transistor $TR_D$ is connected to one electrode of the capacitor $C_1$ and the anode electrode of the light emitting unit ELP.

The other end (specifically, cathode electrode) of the light emitting unit ELP is connected to the second feeder line PS2. The capacitance of the light emitting unit ELP is expressed by the reference $C_{EL}$.

In a state where a voltage corresponding to the gradation signal $D_{Sig(q,p)}$ of the image to be displayed is supplied from the data driver 102 to the data line $DTL_q$, when the writing transistor $TR_W$ is brought into a conductive state in response to the scanning signal from the scanning unit 101, a voltage corresponding to the luminance of the image to be displayed is written in the capacitor $C_1$. After the writing transistor $TR_W$ is brought into a non-conductive state, a current flows through the driving transistor $TR_D$ in accordance with the voltage held in the capacitor $C_1$, and the light emitting unit ELP emits light.

The configuration of the active matrix type organic EL display device which is the premise of the present disclosure has been described above.

The display device 1 employs a method for combining a white organic EL element and a color filter to extract white light by laminating light emitting layers of three colors of red, green, and blue (referred to as "white method" below) as a method for realizing full color. In a method for coloring the light emitting layer for each color, there is a problem in positioning accuracy of the masks. However, the white method does not need the positioning of the masks. Therefore, the white method is useful for fine pixel pitches of several microns like a pixel pitch of a microdisplay.

First Embodiment

Figure 2:
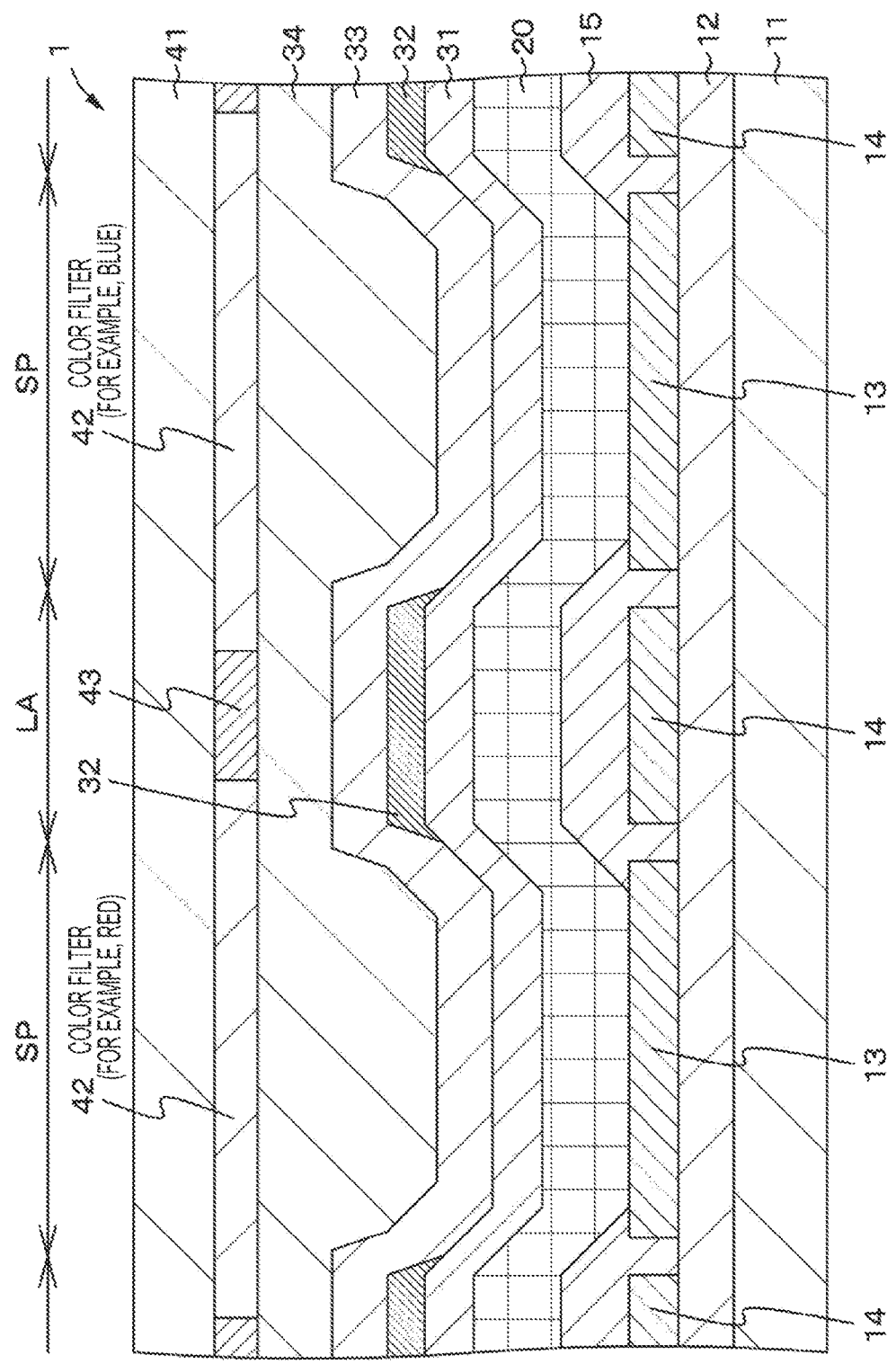
FIG. 2 is a schematic partial cross-sectional diagram of a display device according to a first embodiment.

FIG. 2 is a schematic partial cross-sectional diagram of a display device according to a first embodiment. Furthermore, for convenience of illustration, a part corresponding to two adjacent pixels (for example, pixel for displaying red and pixel for displaying blue adjacent to the same) is illustrated. This is similarly applied to the other drawings to be described later. In FIG. 2, the reference SP indicates a region corresponding to the pixel, and the reference LA indicates a region between the pixels.

The display device 1 includes a first electrode 13 provided for each pixel, an insulating layer 15 having openings opposed to the respective first electrodes 13, an organic layer 20 including a light emitting layer common to all the pixels, and a second electrode 31 formed on the entire surface of the organic layer 20 laminated on a first substrate 11, for example, made of a glass material (more specifically, on a flattening film 12 described later). The organic layer 20 includes, for example, a plurality of layers such as a hole injection and transport layer, a red light emitting layer, a green light emitting layer, a blue light emitting layer, and an electron transporting layer. However, for convenience of illustration, these layers are illustrated as a single layer. Furthermore, a reflection plate 14 which is in the same layer as the first electrode 13 is provided on the first substrate 11 in the part between the adjacent pixels.

The reference 12 indicates, for example, a flattening film for covering various electrodes of transistors $TR_W$ and $TR_D$, electrodes forming a capacitor $C_1$, and various signal lines. Furthermore, for convenience of drawing, transistors, capacitors, contact holes, various signal lines and the like are omitted in FIG. 2. This is similarly applied to FIGS. 3 to 6 and FIGS. 8 to 15.

The transistors $TR_W$ and $TR_D$ are, for example, bottom-gate thin film transistors, and have gate electrodes in selective regions on the substrate. In each transistor, a gate insulating film is provided over the entire surface of the substrate so as to cover the gate electrode and the substrate. A semiconductor layer is formed on the gate insulating film. The semiconductor layer is formed of amorphous silicon, polycrystalline silicon, or an oxide semiconductor. An interlayer insulating film having a contact hole is formed on the semiconductor layer, and a source/drain electrode which functions as a source or a drain is arranged on the interlayer insulating film to be fitted into the contact hole.

The flattening film 12 can be made of an organic material such as polyimide, acrylic resin, or novolac resin, or an inorganic material such as silicon oxide ($SiO_x$), silicon nitride ($SiN_x$), or silicon oxynitride ($SiO_xN_y$). One source/drain region of the driving transistor $TR_W$ is electrically connected to the first electrode 13 with the contact hole which is not shown.

The first electrode 13 and the reflection plate 14 are made of light reflecting materials such as aluminum (Al), aluminum alloy, platinum (Pt), gold (Au), chromium (Cr), and tungsten (W). It is preferable that the thickness of the first electrode 13 be set in a range of 50 to 300 nm. Furthermore, the first electrode 13 may be a transparent electrode. However, in this case, it is preferable to provide a reflective electrode made of, for example, the light reflecting material to form a reflective interface between the substrate and the first electrode 13.

The insulating layer 15 provided to insulate the pixels from each other is formed over the entire substrate. The insulating layer 15 can be made of the material similar to that of the flattening film.

The second electrode 31 is formed of a transparent conductive material. An auxiliary wiring 32 made of a metal material is provided in a part between the pixels on the second electrode 31. The auxiliary wiring 32 can substantially reduce a sheet resistance of the transparent electrode. Then, a protective film 33 is formed on the entire surface including the auxiliary wiring 32.

The second electrode 31 is made of a transparent conductive material having excellent light permeability in a visible light region and low resistivity, such as, ITO, IZO, and AZO. It is preferable that the thickness of the second electrode 31 be set in a range of 30 to 300 nm. Furthermore, the second electrode 31 can be formed as a multilayer film. For example, it is possible that a metal layer made of metal such as calcium (Ca), barium (Ba), lithium (Li), cesium (Cs), indium (In), magnesium (Mg), silver (Ag) or an alloy thereof is formed with a film thickness equal to or less than five nm as a first layer and a second layer is made of the transparent conductive material.

The auxiliary wiring 32 on the second electrode 31 is made of a material having a high electric conductivity such as silver (Ag), copper (Cu), gold (Au), aluminum (Al), magnesium (Mg), tungsten (W) or an alloy thereof.

The protective film 33 formed on the entire surface including the auxiliary wiring 32 is provided to prevent moisture and gas from entering the organic layer 20 and is made of a material having low permeability and low water permeability. As the material of the protective film, silicon nitride ($SiN_x$), silicon oxide ($SiO_x$), aluminum oxide ($AlO_x$), or a combination thereof is used. The thickness of the protective film is one to eight m.

A second substrate 41 opposed to the first substrate 11 is made of, for example, a glass material, and a light shielding film 43 as a black matrix is formed on the inner surface of the second substrate 41 in addition to a color filter 42 corresponding to the pixel. After the protective film 33 has been formed on the first substrate 11, a UV curing resin or a thermosetting resin forming the adhesive layer 34 is applied to the second substrate 41 to be bonded to the protective film 33 so that both of them are sealed. The white light of the organic layer 20 is color-separated by the color filter 42, and light corresponding to the pixel is emitted from the second substrate 41.

Although the description will be made later with reference to FIG. 8, the part corresponding to the pixel is configured to form a resonance structure for absorbing energy rays between a reflective surface on the side of the first substrate 11 and a reflective surface on the second electrode 31 when it is assumed that the reflective surface be formed on the second electrode 31. In the example illustrated in FIG. 8, the reflective surface on the side of the first substrate 11 is configured of the surface of the first electrode 13 made of a metal material. Furthermore, as described above, a mode can be used in which the first electrode 13 is made of a transparent conductive material and the reflective surface on the side of the first substrate 11 is configured of the surface of the reflective electrode provided separately from the first electrode 13. Furthermore, the part between the adjacent pixels is configured to form a resonance structure for reflecting the energy rays between the reflective surface on the side of the first substrate 11 and the reflective surface on the second electrode 31 when it is assumed that the reflective surface be formed on the second electrode 31. In the example illustrated in FIG. 8, the reflective surface on the side of the first substrate 11 in the part between the adjacent pixels is formed of the surface of the reflection plate 14 provided on the first substrate 11 in the part between the adjacent pixels.

Next, the organic layer 20 configuring a light emitting unit ELP illustrated in FIG. 1 is described. The light emitting unit ELP includes the first electrode 13, the organic layer 20, and the second electrode 31 laminated on the first substrate 11.

The laminated structure of the organic layer 20 is not particularly limited as long as the organic layer 20 can emit light in each wavelength region of RGB. For example, the light emitting layer may be a lamination of a red light emitting layer, a green light emitting layer, and a blue light emitting layer, or may be a lamination of the blue light emitting layer and a yellow light emitting layer. Furthermore, a tandem structure via a CGL layer can be employed. Here, the description will be made as it is assumed that the organic layer 20 have a laminated structure including the hole injection and transport layer, the red light emitting layer, the green light emitting layer, the blue light emitting layer, the electron transporting layer, and the like.

The hole injection and transport layer included in the organic layer 20 has a function of injecting holes from the first electrode 13 and transporting the holes to the light emitting layer. For example, the hole injection and transport layer is made of a material such as 4-(N,N-bis (p-methylphenyl)amino)-α-phenylstilbene and N,N'-bis (4'-diphenylamino-4-biphenylyl)-N,N'-diphenylbenzidine.

The light emitting layers included in the organic layer 20 can be made of a known material. The light emitting layer may be made of a fluorescent material or a phosphorescent material. For example, the red light emitting layer is made of a mixture of 30 wt. % of 2,6-bis [(4'-methoxydiphenylamino) styryl]-1,5-dicyanonaphthalene (BSN) in 4,4-bis (2,2-diphenylvinin) biphenyl (DPVBi). The green light emitting layer is made of, for example, a mixture of five wt. % of coumarin 6 in DPVBi. The blue light emitting layer is made of, for example, a mixture of 2.5 wt. % of 4,4'-bis [2-{4-(N,N-diphenylamino)phenyl}vinyl]biphenyl (DPAVBi) in DPVBi.

For the electron transporting layer, for example, 2,9-dimethyl-4,7-diphenyl-1,10-phenanthroline (BCP), aluminum quinolinol ($Alq_3$), bathophenanthroline (Bphen) are used. The electron transporting layer includes one or more layers and may include at least one electron transporting layer doped with alkali metal or alkaline earth metal. The electron transporting layer doped with an alkali metal or an alkaline earth metal is made of, for example, BCP, $Alq_3$, or Bphen as a host material, doped with 0.5 to 15 wt % of a dopant material of by co-vapor deposition. As the dopant material, alkali metals such as lithium (Li), sodium (Na), potassium (K), rubidium (Rb) and cesium (Cs) or alkali earth metals such as magnesium (Mg), calcium (Ca), strontium (Sr), barium (Ba) can be exemplified.

A configuration in which an electron injection layer is provided between the electron transporting layer and the second electrode 31 may be employed. The electron injection layer increases the injection of electrons from the second electrode 31 and is made of, for example, lithium fluoride (LiF).

Regarding the thickness of each layer forming the organic layer 20, it is preferable that the thickness of the hole injection and transport layer be set to one to 200 nm, the thickness of the light emitting layer be set to five to 50 nm, and the thickness of the electron transporting layer be set to 10 to 200 nm. The thickness of each layer forming the organic layer 20 is set to a value such that the optical film thickness enables the resonance structure.

The structure of the display device 1 has been described. Next, a method of manufacturing the display device 1 is described with reference to FIGS. 3A to 11.

First, a drive circuit including the transistors $TR_W$ and $TR_D$, the capacitor $C_1$, and the like is formed on the first substrate 11 on the basis of a known thin film process. Next, the flattening film 12 is formed over the entire surface, for example, by a spin coating method or a slit coating method. Subsequently, the flattening film 12 is patterned into a predetermined shape, for example, by photolithography, and a contact hole to connect the transistor with the first electrode 13 is formed (refer to FIG. 3A).

Figure 3A:
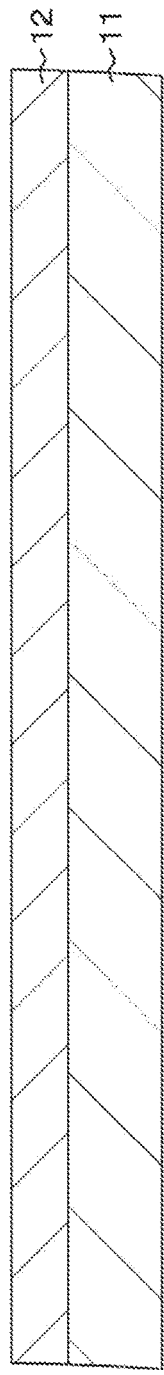
FIGS. 3A to 3C are schematic partial cross-sectional diagrams of a first substrate and the like to describe a method of manufacturing the display device according to the first embodiment.
Figure 3B:
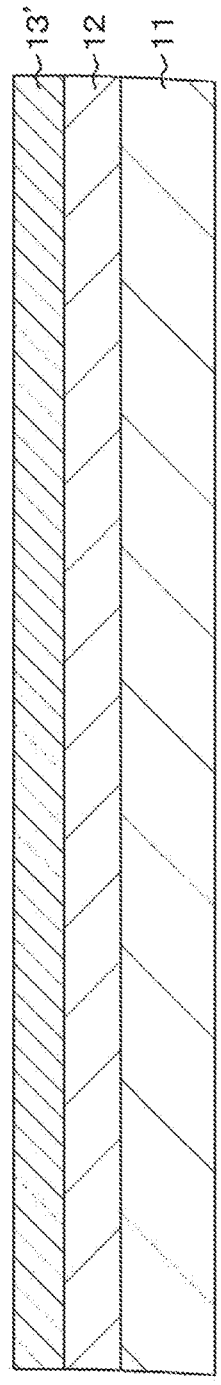
Figure 3C:
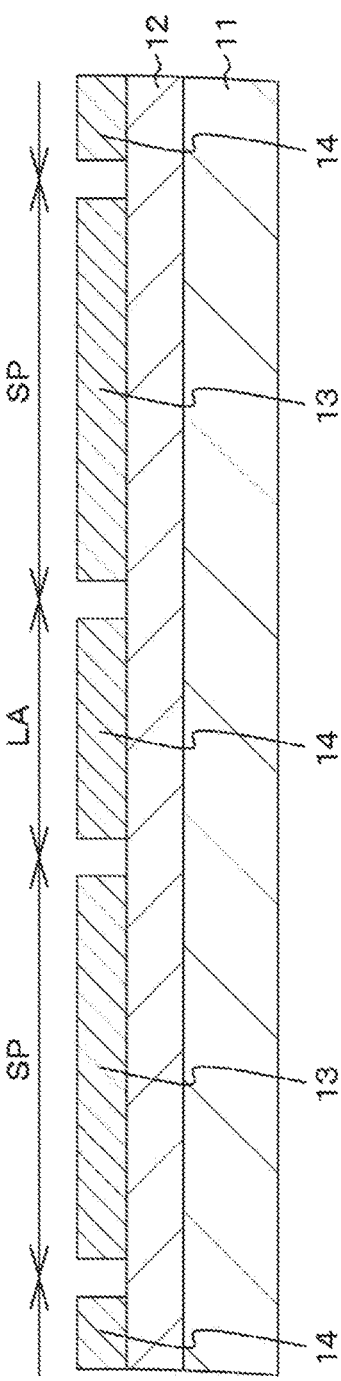

Subsequently, for example, aluminum (Al) is vapor-deposited on the entire surface to form a metallic material layer 13' (refer to FIG. 3B). In addition to the first electrode 13, the metallic material layer 13' is used to form the reflection plate 14. Subsequently, the metallic material layer 13' is patterned into a predetermined shape, for example, by the photolithography, and the first electrode 13 and the reflection plate 14 are formed (refer to FIG. 3C).

Figure 4A:
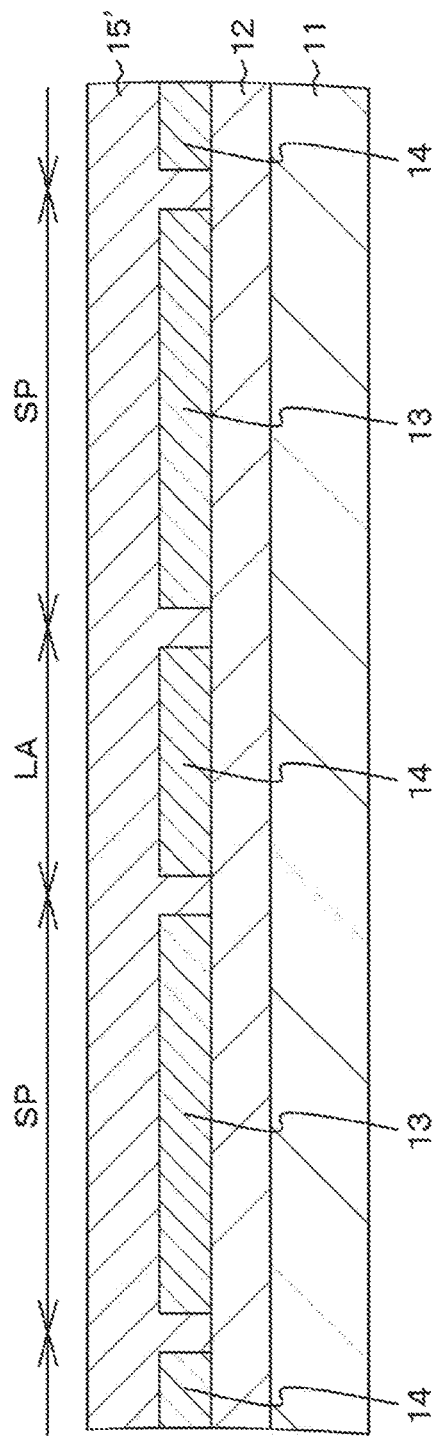
FIGS. 4A and 4B are continued from FIG. 3C and are schematic partial cross-sectional diagrams of the first substrate and the like to describe the method of manufacturing the display device according to the first embodiment
Figure 4B:
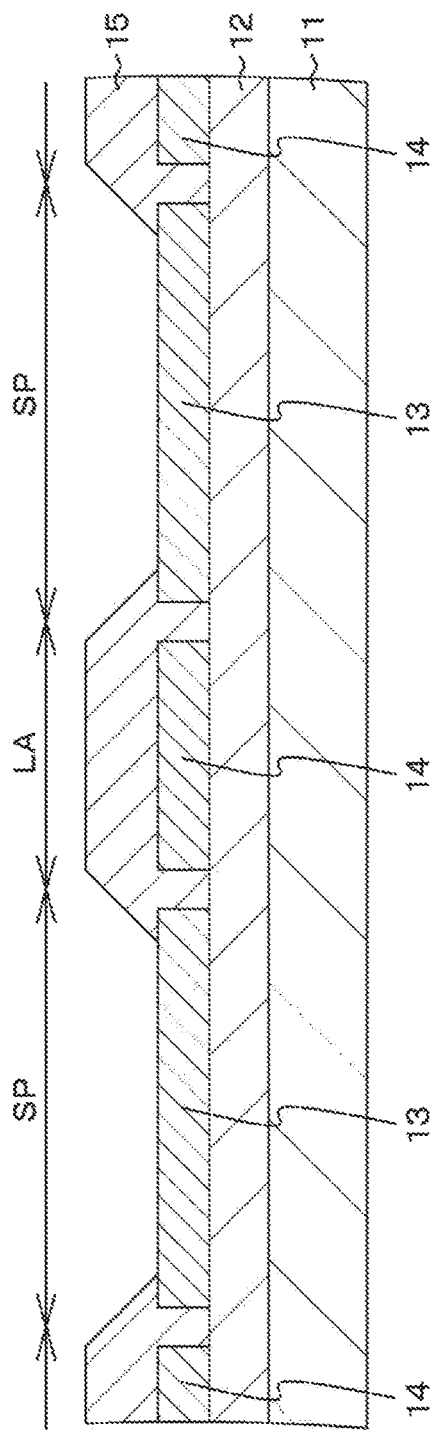

Next, an insulating material film 15' made of, for example, silicon oxide is formed on the entire surface by a CVD method or a sputtering method (refer to FIG. 4A). Subsequently, a part of the insulating material film 15' corresponding to the pixel is removed by, for example, a dry etching method so that the insulating layer 15 having an opening to expose the first electrode 13 is formed (refer to FIG. 4B).

Figure 5A:
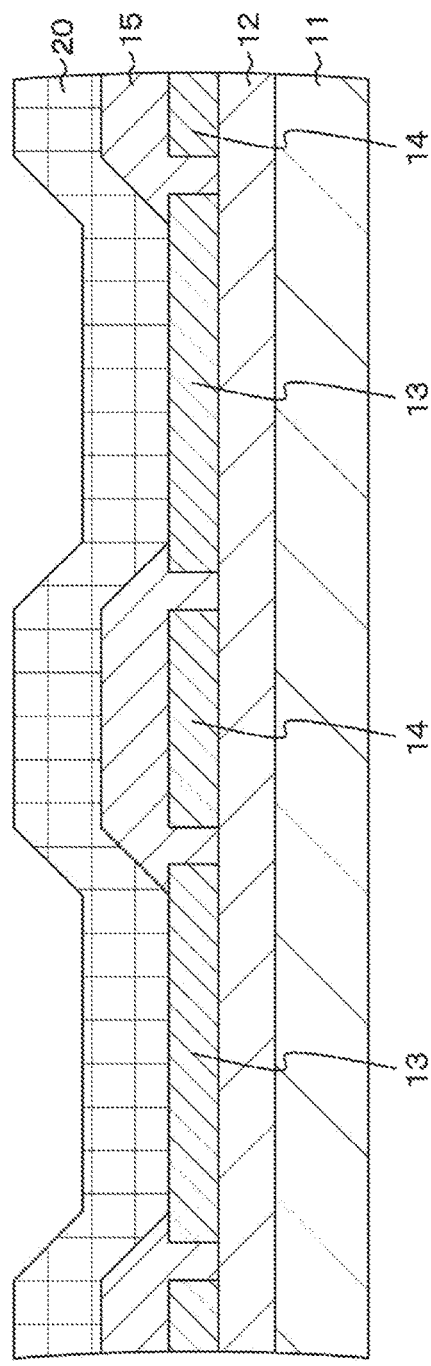
FIGS. 5A and 5B are continued from FIG. 4B and are schematic partial cross-sectional diagrams of the first substrate and the like to describe the method of manufacturing the display device according to the first embodiment
Figure 5B:
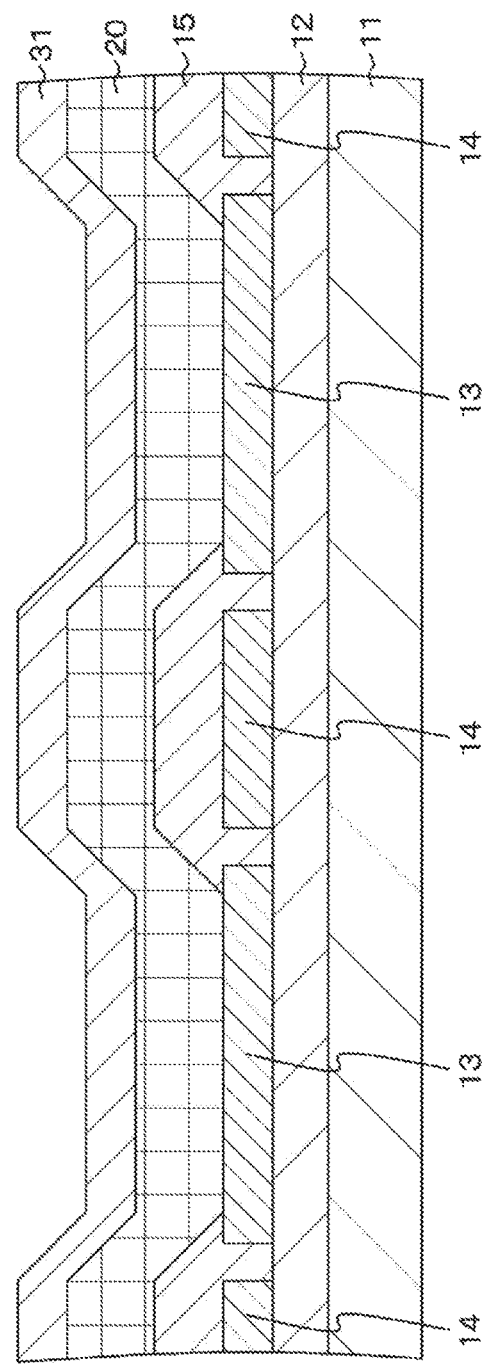

Next, the hole injection and transport layer, the blue light emitting layer, the green light emitting layer, the red light emitting layer, the electron transporting layer, and the electron injection layer are sequentially laminated on the entire surface to form the organic layer 20 (refer to FIG. 5A). Subsequently, the second electrode 31 made of, for example, IZO is formed on the entire surface by, for example, a vapor deposition method (refer to FIG. 5B).

Next, the metallic material layer 32' made of an alloy of, for example, magnesium (Mg) and silver (Ag) is formed on the entire surface by, for example, the vapor deposition method (refer to FIG. 6).

Subsequently, a process of irradiating the energy rays (specifically, laser beam) from the side of the metallic material layer 32' is performed. To facilitate the understanding of the present disclosure, first, optical characteristics of a multilayer film is described.

Figure 7:
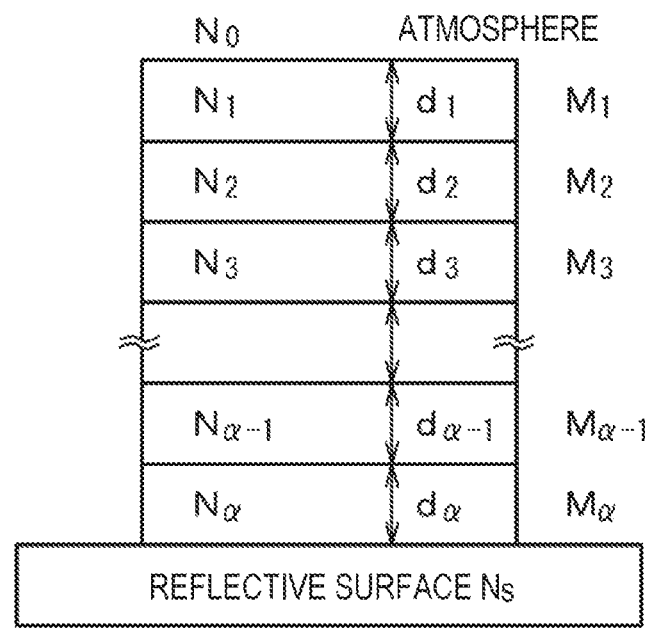
FIG. 7 is a schematic end view to describe optical characteristics of a multilayer film.

FIG. 7 is a schematic end view to describe the optical characteristics of the multilayer film. Specifically, the configuration of the multilayer film is illustrated in which a first layer, a second layer, . . . , and a α-th layer are sequentially laminated. Here, if a number of the layer forming the multilayer film is expressed by the reference β (β is natural number of one to α), the complex index of refraction of the β-th layer is expressed by the following formula (1). Furthermore, the film thickness of the β-th layer is expressed by the following formula (2). Furthermore, the complex index of refraction can be obtained by measurement by using, for example, an ellipsometer.

[Mathematical Formula 1]

COMPLEX INDEX: $N_\beta = n_\beta - iK_\beta$ (1)

[Mathematical Formula 2]

FILM THICKNESS: $d_\beta$ (2)

In the β-th layer, a transfer matrix is expressed by the formula (3), and a phase difference is expressed by the formula (4). Furthermore, a coefficient "rβ" in the transfer matrix is expressed by the formula (5) in a case of S polarization and is expressed by the formula (6) in a case of P polarization. The reference "λ" is the wavelength of light for entering the multilayer film, the reference "c" is the speed of light, the reference "$\mu_0$" is vacuum magnetic permeability, and the reference "θβ" is the incident angle of light entering each layer.

[Mathematical Formula 3]

TRANSFER MATRIX: $M_\beta = \begin{bmatrix} \cos\delta_\beta & i/\eta_\beta \sin\delta_\beta \\ i\eta_\beta \sin\delta_\beta & \cos\delta_\beta \end{bmatrix}$ (3)

[Mathematical Formula 4]

PHASE DIFFERENCE: $\delta_\beta = \dfrac{2\pi N_\beta d_\beta \cos\theta_\beta}{\lambda}$ (4)

[Mathematical Formula 5]

S POLARIZATION: $\eta_\beta = \dfrac{N_\beta \cos\theta_\beta}{c\mu_0}$ (5)

[Mathematical Formula 6]

P POLARIZATION: $\eta_\beta = \dfrac{N_\beta}{c\mu_0 \cos\theta_\beta}$ (6)

If the light perpendicularly enters the multilayer in FIG. 7, Cos(θβ)=1 is satisfied. At this time, the formulas (5) and (6) have the same values and are expressed by the following formula (7). Furthermore, the phase difference is expressed by the formula (8).

[Mathematical Formula 7]

$\eta_\beta = \dfrac{N_\beta}{c\mu_0}$ (7)

[Mathematical Formula 8]

PHASE DIFFERENCE: $\delta_\beta = \dfrac{2\pi N_\beta d_\beta}{\lambda}$ (8)

The transfer matrix of the multilayer film is expressed by a product of the transfer matrixes of the layers. Therefore, the transfer matrix of the entire multilayer film is expressed by the following formula (9) having the references "A", "B", "C", and "D" as coefficients. Furthermore, a reflectance of an electric field is expressed by the following formula (10). Therefore, a reflectance of light is expressed by the following formula (11).

[Mathematical Formula 9]

PRODUCT OF TRANSFER MATRIXES: (9)

$M = M_1 M_2 M_3 \ldots M_{\alpha-1} M_\alpha = \begin{bmatrix} A & iB \\ iC & D \end{bmatrix}$

[Mathematical Formula 10]

REFLECTANCE OF ELECTRIC FIELD: (10)

$r = \dfrac{\eta_0 A - i\eta_0 \eta_s B + iC - \eta_s D}{\eta_0 A - i\eta_0 \eta_s B - iC + \eta_s D}$

[Mathematical Formula 11]

REFLECTANCE OF LIGHT: $R = |r|^2$ (11)

The optical characteristics of the multilayer film have been described above.

Figure 8:
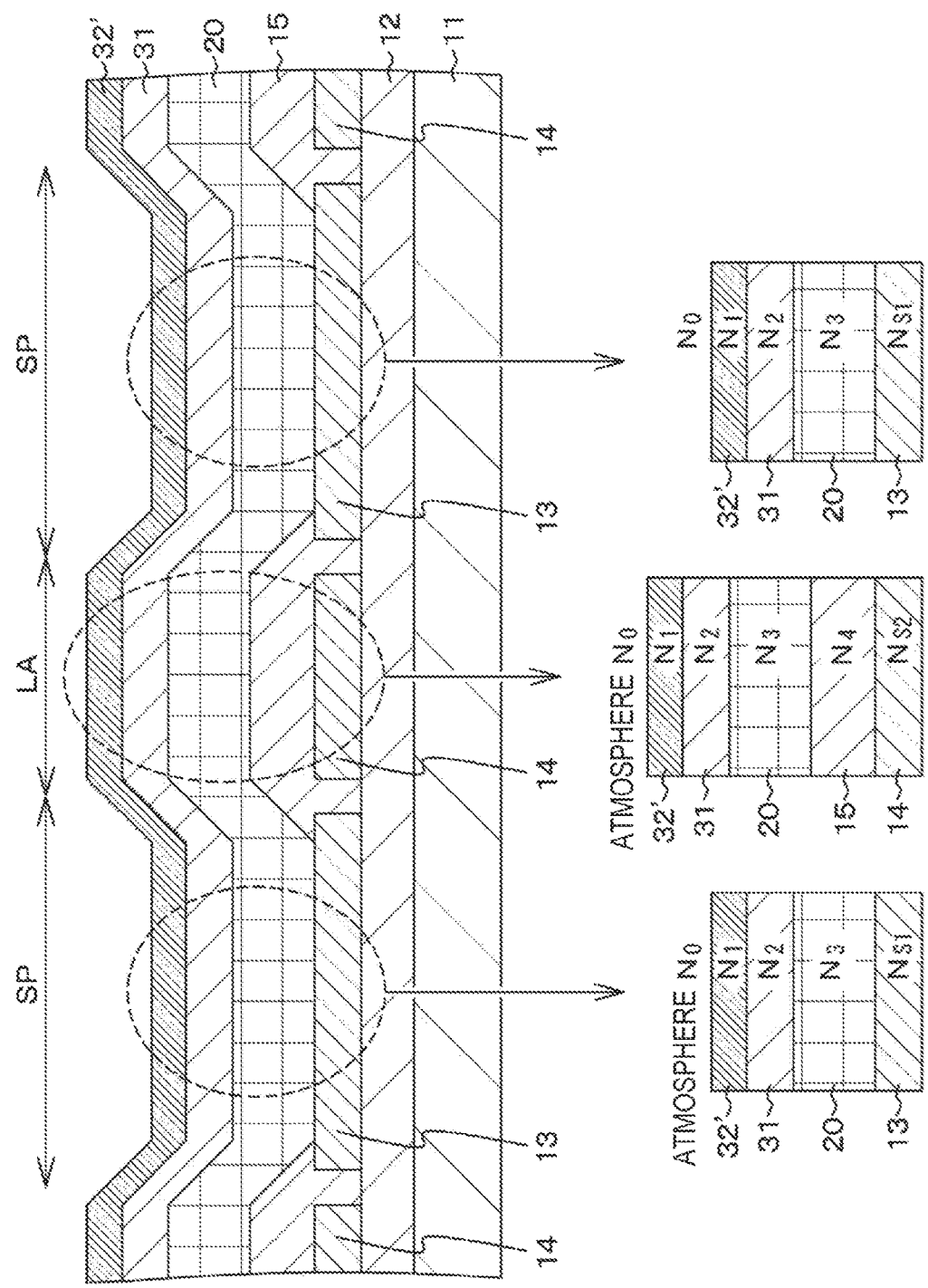
FIG. 8 is a schematic partial end view to describe a layer configuration in a region corresponding to a pixel portion and a layer configuration in a region of a lattice part for partitioning the pixel portion.

As illustrated in FIG. 8, the part corresponding to the pixel has the structure in which [the first electrode 13, the organic layer 20, the second electrode 31, the metallic material layer 32'] are laminated. On the other hand, the part between the pixels has the structure in which [the reflection plate 14 (same material as first electrode 13), the insulating layer 15, the organic layer 20, the second electrode 31, the metallic material layer 32'] are laminated.

Therefore, by adjusting the film thickness and the material of the insulating layer 15, the reflectance relative to the incident light of the part of the pixel and that of the part between the pixels can be set to have a difference.

A layer structure illustrated in FIG. 8 is described. The part corresponding to the pixel is configured to form the resonance structure for absorbing the energy rays between the reflective surface on the side of the first substrate 11 and the reflective surface formed of the metallic material layer 32' on the second electrode 31 is formed. The reflective surface on the side of the first substrate 11 is formed of the surface of the first electrode 13 made of a metal material. Furthermore, the part between the adjacent pixels is configured to form the resonance structure for reflecting the energy rays between the reflective surface on the side of the first substrate 11 and the reflective surface formed of the metallic material layer 32' on the second electrode 31. The reflective surface on the side of the first substrate 11 in the part between the adjacent pixels is formed of the surface of the reflection plate 14 provided on the first substrate 11 in the part between the adjacent pixels.

For example, it is assumed that the materials and the film thicknesses of the organic layer 20, the insulating layer 15, the second electrode 31 are set so that the reflectance of the part corresponding to the pixel relative to the light with the wavelength of 1064 nm is one % and that of the part between the pixels is 99%. At this time, for example, when light is emitted by using a Nd: YAG laser having the wavelength of 1064 nm, light is almost absorbed in the part of the pixel. Whereas, in the part between the pixels, the light is almost reflected. With this setting, when the metallic material layer 32' is removed by the irradiation of the light, a difference in processability between the part of the pixel and the part between the pixels can be made.

An extreme value has been described as an example of the reflectance. However, in practice, it is desirable to set the reflectance relative to the light to be emitted be set equal to or less than 40% in the part corresponding to the pixel, and more preferably, equal to or less than 30%. On the other hand, in the part between the pixels, it is desirable that the reflectance relative to the light to be emitted be set equal to or more than 70%, and more preferably, equal to or more than 80%.

For example, when the thickness of the organic layer 20 is set to be 170 nm, the thickness of the second electrode 31 made of IZO is set to be 50 nm, the thickness of the metallic material layer 32' made of an alloy of magnesium (Mg) and silver (Ag) is set to be 20 nm, and the thickness of the insulating layer 15 made of silicon oxide is set to be 70 nm, the layer structure which can satisfy the above conditions can be obtained.

Subsequently, a manufacturing method according to the present disclosure is described. After the metallic material layer 32' is formed on the entire surface of the second electrode 31, the metallic material layer is irradiated with the energy rays from the side of the metallic material layer 32', and the metallic material layer 32' is selectively removed by the energy absorbed by the part corresponding to the pixel. In this way, a process for forming the auxiliary wiring 32 made of a metallic material layer is performed.

Figure 9:
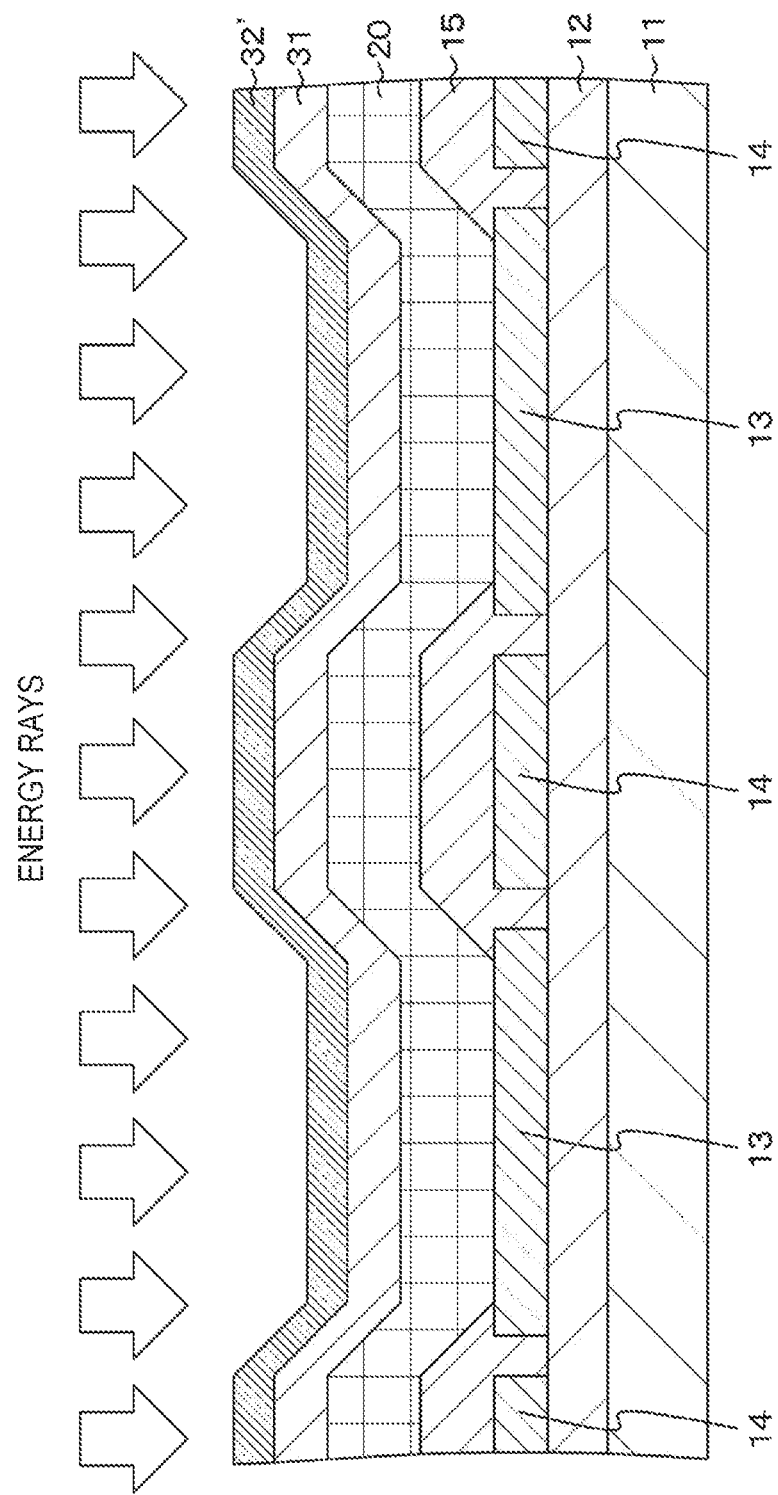
FIG. 9 is continued from FIG. 6 and is a schematic partial cross-sectional diagram of the first substrate and the like to describe the method of manufacturing the display device according to the first embodiment
Figure 10:
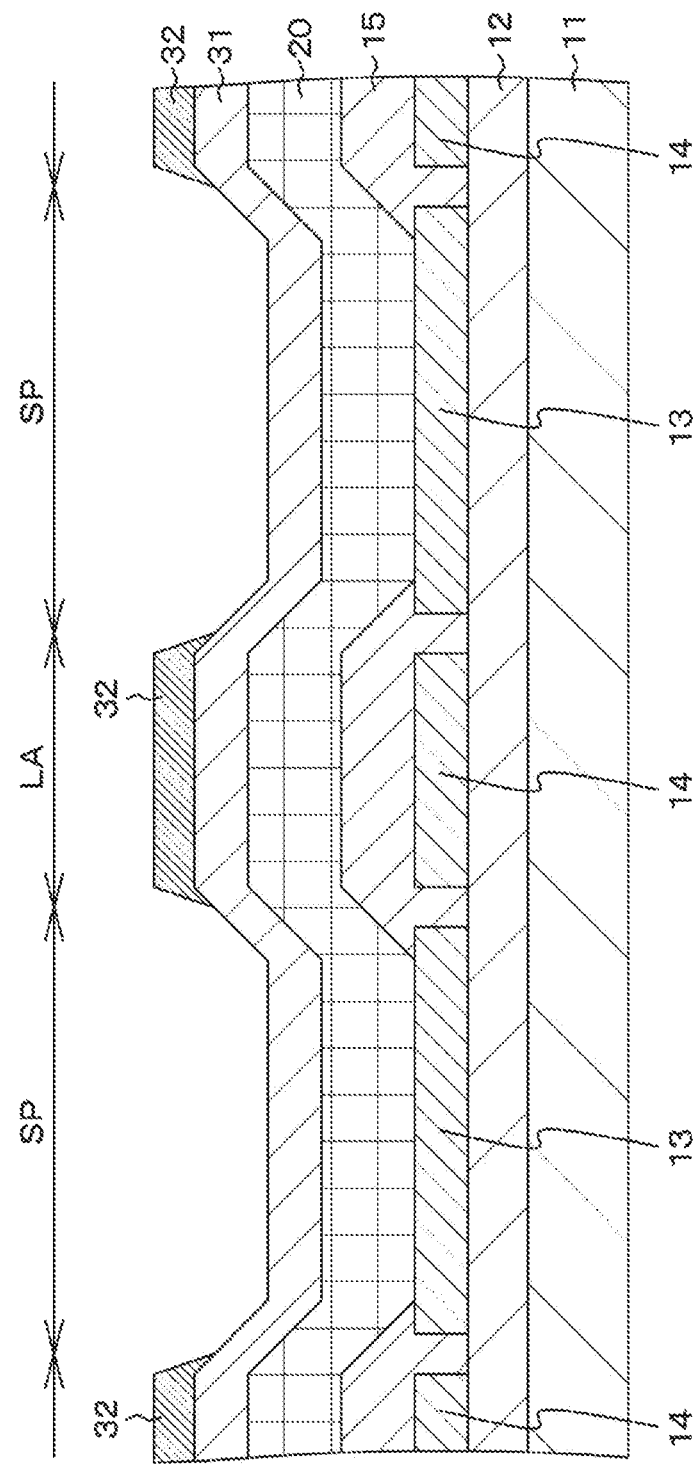
FIG. 10 is continued from FIG. 9 and is a schematic partial cross-sectional diagram of the first substrate and the like to describe the method of manufacturing the display device according to the first embodiment

Specifically, as illustrated in FIG. 9, the entire surface is irradiated with a Nd: YAG laser beam having a wavelength of 1064 nm from the side of the metallic material layer 32'. The intensity of the light to be radiated may be appropriately set, for example, according to experiments or the like so that the metallic material layer 32' is removed in the part corresponding to the pixel and the metallic material layer 32' remains in the part between the pixels.

By the irradiation of the energy rays, the metallic material layer 32' is selectively removed by the energy absorbed by the part corresponding to the pixel, and the metallic material layer 32' remains in the part between the pixels. Accordingly, the auxiliary wiring 32 formed of the metallic material layer 32' can be obtained (refer to FIG. 10).

Figure 11:
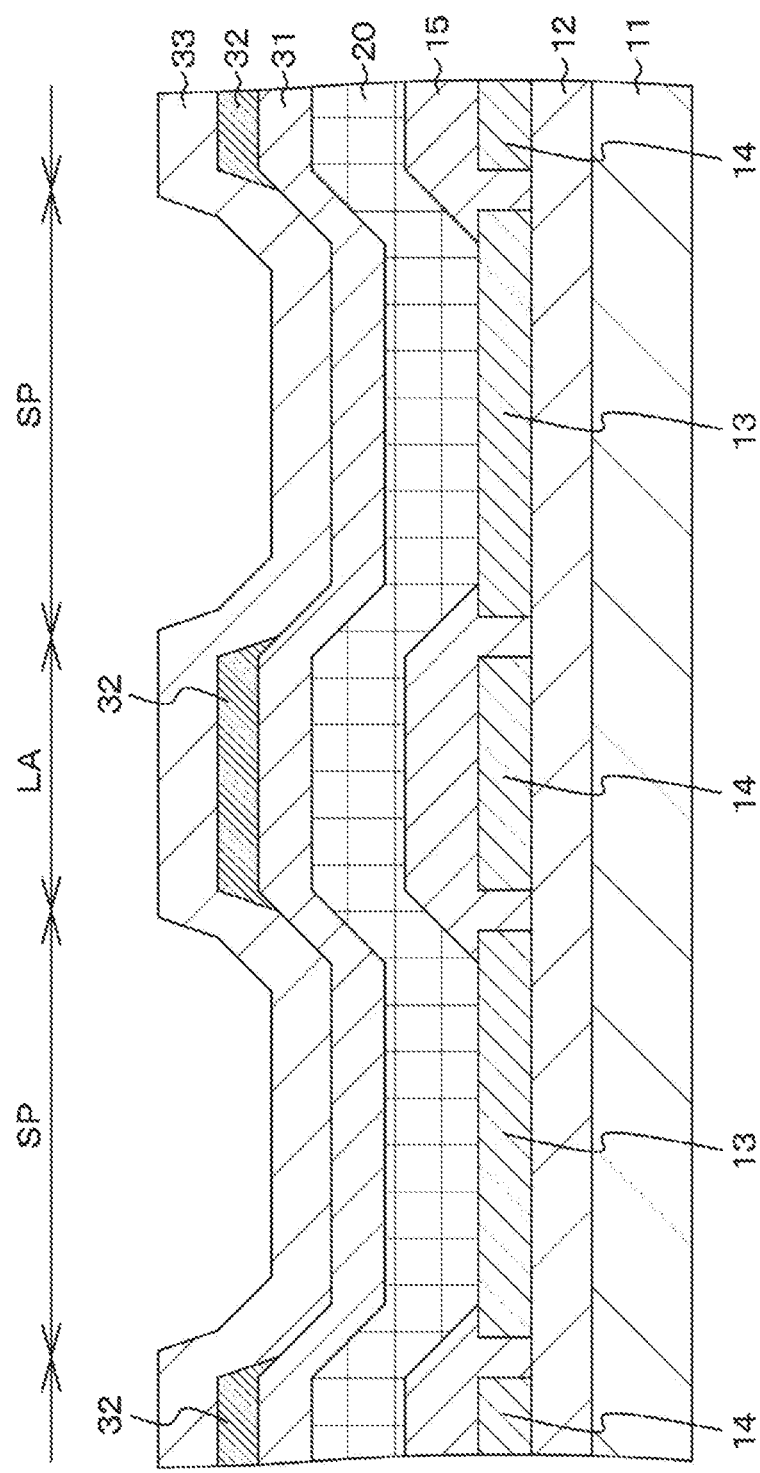
FIG. 11 is continued from FIG. 10 and is a schematic partial cross-sectional diagram of the first substrate and the like to describe the method of manufacturing the display device according to the first embodiment

Next, the protective film 33 is formed on the entire surface (refer to FIG. 11). Subsequently, a UV curing resin or a thermosetting resin for forming the adhesive layer 34 is applied, and the second substrate 41 on which a color filter and the like are formed is bonded to the protective film 33 to seal between them. With this process, the display device illustrated in FIG. 2 can be obtained.

As described above, when the metallic material layer 32' is removed by the irradiation of the light, a difference in processability between the part of the pixel and the part between the pixels can be made. Therefore, the auxiliary wiring can be formed to be superposed on the transparent electrode (second electrode) with high accuracy by using a simple method of irradiating the entire surface with the energy rays.

Second Embodiment

Figure 12:
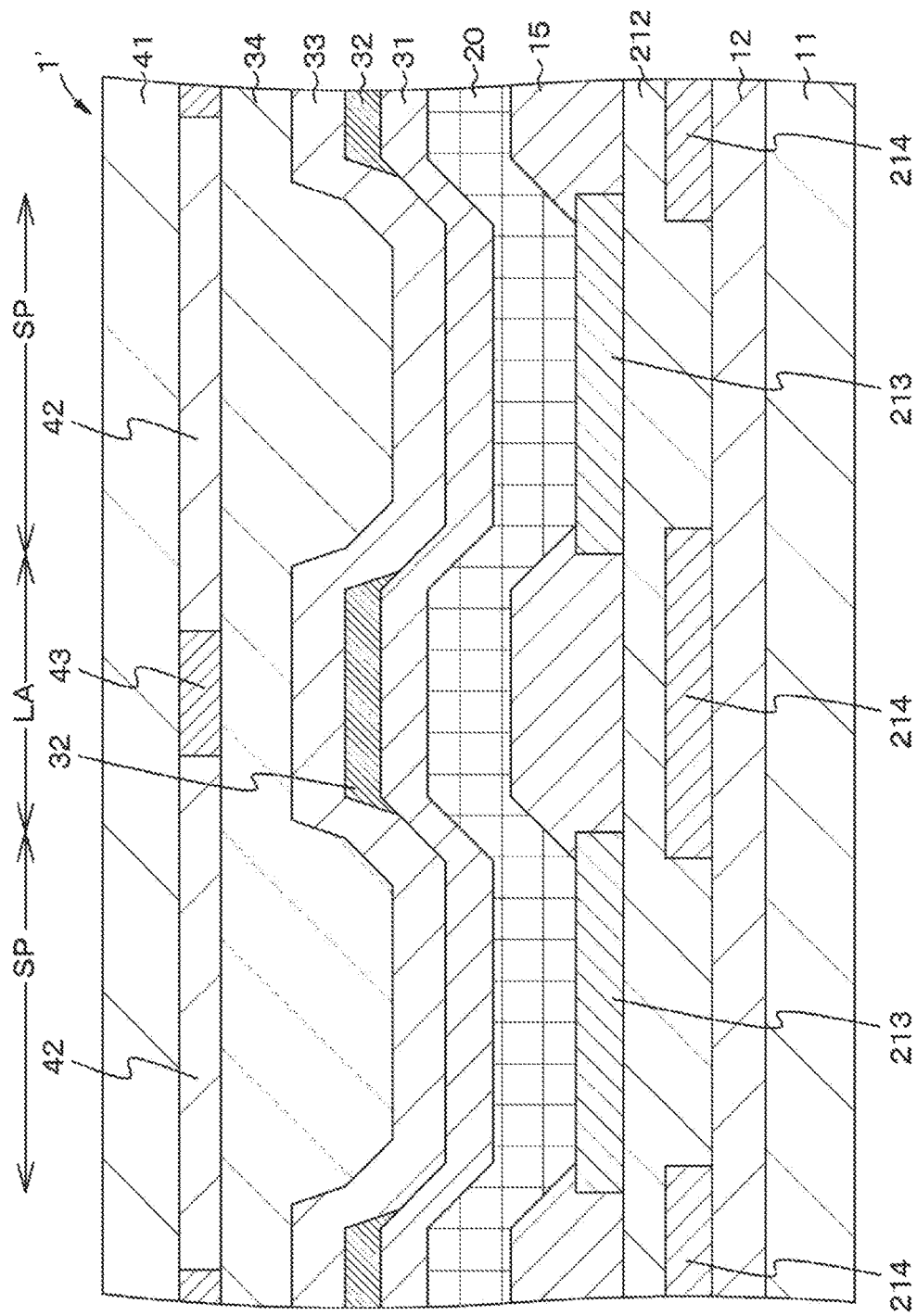
FIG. 12 is a schematic partial cross-sectional diagram of a display device according to a second embodiment.
Figure 15:
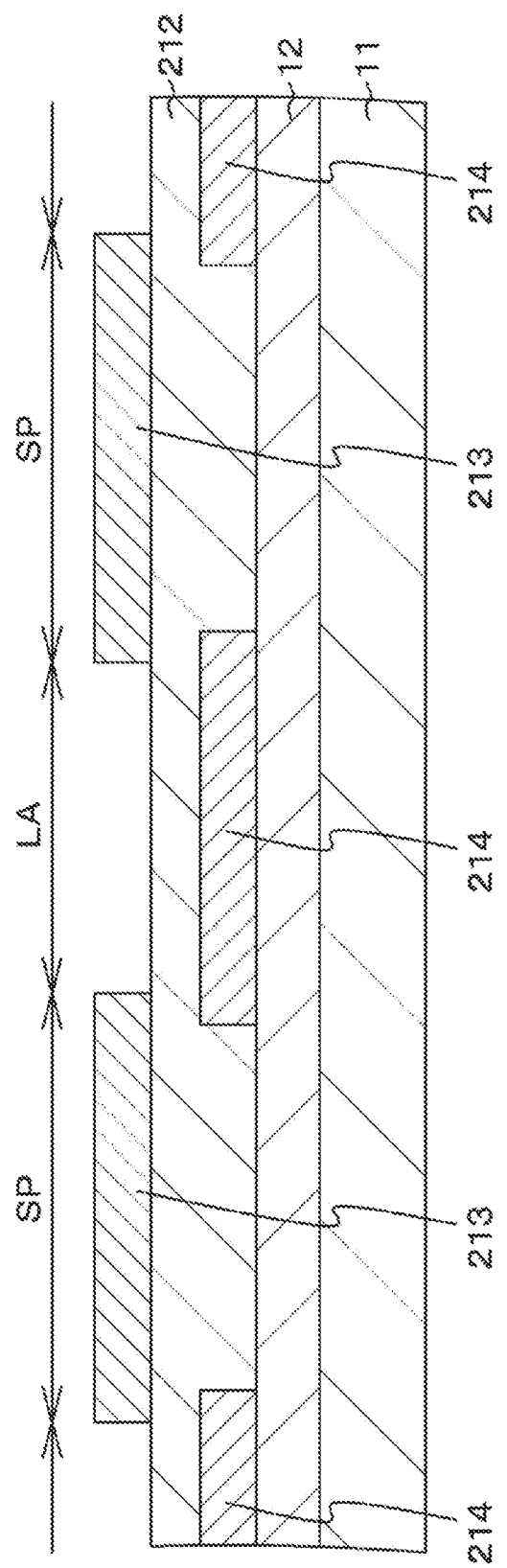
FIG. 15 is continued from FIG. 14B and is a schematic partial cross-sectional diagram of the first substrate and the like to describe the method of manufacturing the display device according to the second display device

FIG. 12 is a schematic partial cross-sectional diagram of a display device according to a second embodiment.

In the first embodiment, it has been assumed that the reflection plate 14 is provided in the same layer as the first electrode 13. On the other hand, in a display device 1' according to the second embodiment, a reflection plate 214 is formed in a layer different from a first electrode 213, specifically, the reflection plate 214 is provided in the lower layer of the first electrode 213 via a second flattening film 212. In this regard, the second embodiment is mainly different from the first embodiment.

In the first embodiment, since it is necessary to electrically insulate the reflection plate 14 and the first electrode 13, the configuration cannot be used in which the reflection plate 14 and the first electrode 13 are overlapped with each other. On the other hand, in the second embodiment, the reflection plate 214 can be formed to overlap with the first electrodes 213 on a part between the first electrodes 213. Therefore, the area of the reflection plate can be increased than that in the first embodiment.

The structure of the display device 1' has been described. Next, a method of manufacturing the display device 1' is described with reference to FIGS. 13A to 15.

First, a drive circuit including the transistors $TR_W$ and $TR_D$, the capacitor $C_1$, and the like is formed on the first substrate 11 on the basis of a known thin film process. Next, the flattening film 12 is formed over the entire surface, for example, by a spin coating method or a slit coating method. Subsequently, the flattening film 12 is patterned into a predetermined shape, for example, by the photolithography (refer to FIG. 13A).

Subsequently, for example, aluminum (Al) is vapor-deposited on the entire surface to form a metallic material layer 214' (refer to FIG. 13B). The metallic material layer 214' is used to form the reflection plate 214. Subsequently, the metallic material layer 214' is patterned into a predetermined shape, for example, by the photolithography, and the reflection plate 214 is formed (refer to FIG. 13C).

Next, the second flattening film 212 as an insulating layer is formed over the entire surface, for example, by a spin coating method or a slit coating method. Subsequently, the second flattening film 212 is patterned into a predetermined shape, for example, by photolithography, and a contact hole to connect the transistor with the first electrode 213 is formed (refer to FIG. 14A).

Subsequently, for example, aluminum (Al) is vapor-deposited on the entire surface to form a metallic material layer 213' (refer to FIG. 14B). The metallic material layer 213' is used to form the first electrode 213. Subsequently, the metallic material layer 213' is patterned into a predetermined shape, for example, by the photolithography, and the first electrode 213 is formed (refer to FIG. 15).

The subsequent processes are basically similar to those described in the first embodiment with reference to FIGS. 4A to 6 and FIGS. 9 to 11. Therefore, the description is omitted. Furthermore, the part between the pixels has the structure in which [the reflection plate 214, the second flattening film 212, the insulating layer 15, the organic layer 20, the second electrode 31, and the metallic material layer 213'] are laminated. Therefore, it is preferable that the structure be optically designed in consideration of the second flattening film 212, in addition to the insulating layer 15.

In the second embodiment, the reflection plate can be set to be larger than that in the first embodiment. Therefore, since the auxiliary wiring 32 formed as having the remaining metallic material layer 32' can be formed wider, the sheet resistance of the transparent electrode (second electrode) can be further reduced.

Electronic Device

The display device according to the present disclosure described above can be used as a display unit (display device) of electronic devices in all fields that displays a video signal input to an electronic device or a video signal generated in the electronic device as an image or video. For example, the display device can be used as a display unit of a television set, a digital still camera, a laptop personal computer, a mobile terminal device such as a mobile phone, a video camera, and a head mount display.

The display device according to the present disclosure also includes a device having a sealed module shape. As an example, a display module formed by bonding a counter part such as transparent glass to a pixel array unit can be used as the display device. Furthermore, the display module may include a circuit unit to input and output a signal and the like from outside to the pixel array unit, a flexible printed circuit (FPC), and the like. A digital still camera and a head mounted display are described below as specific examples of the electronic device using the display device according to the present disclosure. However, the specific examples here are only exemplary, and the present disclosure is not limited to the examples.

Specific Example 1

Figure 16A:
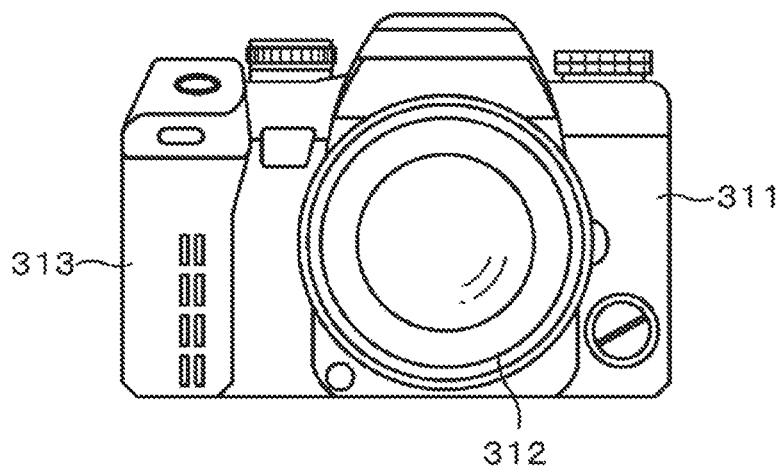
FIGS. 16A and 16B are external views of a lens interchangeable single lens reflex type digital still camera.
Figure 16B:
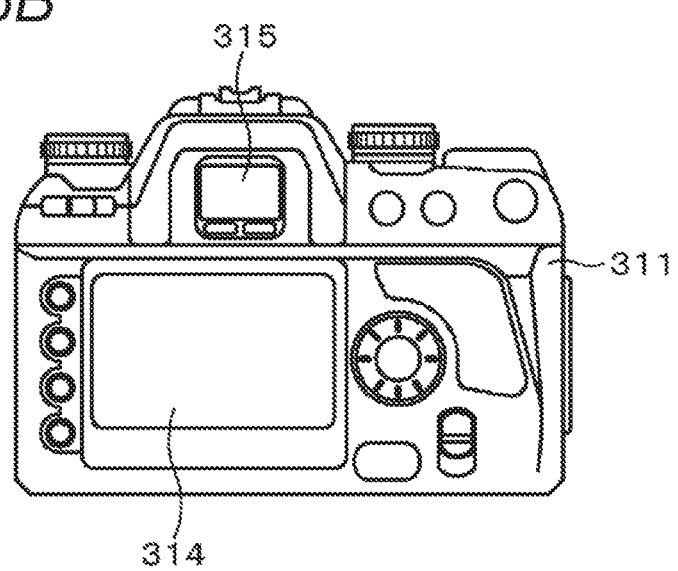

FIGS. 16A and 16B are external views of a lens interchangeable single lens reflex type digital still camera. FIG. 16A is a front view of the digital still camera, and FIG. 16B is a rear view. The lens interchangeable single lens reflex type digital still camera has, for example, an interchangeable photographic lens unit (interchangeable lens) 312 on the front right side of a camera body 311 and a grip part 313 to be held by a photographer on the front left side.

Furthermore, a monitor 314 is provided substantially at the center of the rear surface of the camera body 311. A view finder (eyepiece window) 315 is provided on the upper part of the monitor 314. By viewing the view finder 315, the photographer can visually recognize an optical image of the subject guided from the photographic lens unit 312 and can determine a composition.

In the lens interchangeable single lens reflex type digital still camera having the above configuration, the display device according to the present disclosure can be used as the view finder 315. That is, the lens interchangeable single lens reflex type digital still camera according to this example is manufactured by using the display device according to the present disclosure as the view finder 315.

Specific Example 2

Figure 17:
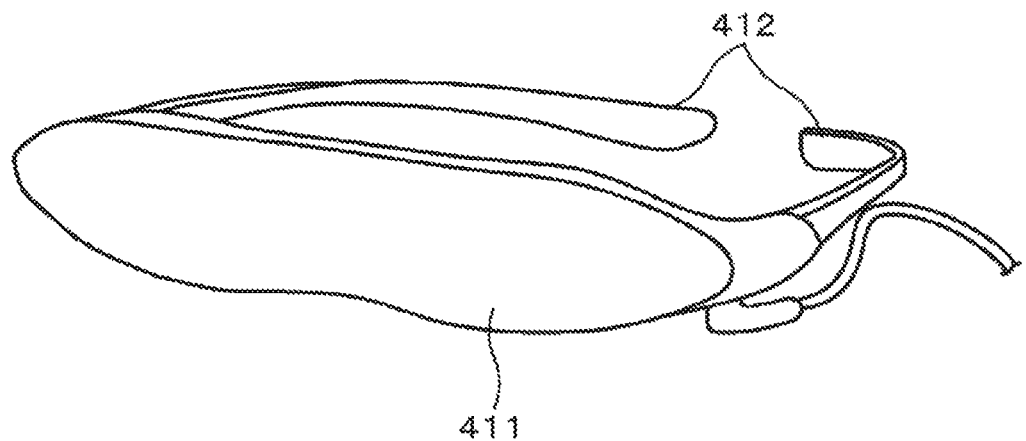
FIG. 17 is an external view of a head mount display.

FIG. 17 is an external view of a head mount display. For example, the head mount display has ear hooking parts 412 on both sides of a glass-shaped display part 411 for attaching the head mount display to the head of the user. In the head mount display, the display device according to the present disclosure can be used as the display part 411. That is, the head mount display according to this example is manufactured by using the display device according to the present disclosure as the display part 411.

Note that the present disclosure can employ the following configuration.

[1]

A method of manufacturing a display device including first electrodes provided for respective pixels, an insulating layer having openings respectively opposed to the first electrodes, an organic layer including a light emitting layer common to all the pixels, and a second electrode formed over an entire surface of the organic layer laminated on a first substrate, the method including:

a step of forming an auxiliary wiring made of a metallic material layer by irradiating the metallic material layer with energy rays from a side of the metallic material layer and selectively removing the metallic material layer by energy absorbed by a part corresponding to the pixel after the metallic material layer has been formed on an entire surface of the second electrode.

[2]

The method of manufacturing a display device according to [1], in which the part corresponding to the pixel is configured to form a resonance structure for absorbing the energy rays between a reflective surface on a side of the first substrate and a reflective surface formed of the metallic material layer on the second electrode.

[3]

The method of manufacturing a display device according to [2], in which the reflective surface on the side of the first substrate is formed of a surface of the first electrode made of a metal material.

[4]

The method of manufacturing a display device according to [2], in which the first electrode is made of a transparent conductive material, and the reflective surface on the side of the first substrate is formed of a surface of a reflective electrode provided separately from the first electrode.

[5]

The method of manufacturing a display device according to any one of [2] to [4], in which a part between adjacent pixels is configured to form a resonance structure for reflecting the energy rays between the reflective surface on the side of the first substrate and the reflective surface formed of the metallic material layer on the second electrode.

[6]

The method of manufacturing a display device according to [5], in which the reflective surface on the side of the first substrate in the part between the adjacent pixels is formed of a surface of a reflection plate provided on the first substrate in the part between the adjacent pixels.

[7]

The method of manufacturing a display device according to any one of [1] to [6], in which the energy ray is a laser beam.

[8]

The method of manufacturing a display device according to [7], in which the energy ray is a laser beam in an infrared region.

[9]

A display device including first electrodes provided for respective pixels, an insulating layer having openings respectively opposed to the first electrodes, an organic layer including a light emitting layer common to all the pixels, and second electrode formed over an entire surface of the organic layer laminated on a first substrate, in which a part corresponding to the pixel is configured to form a resonance structure for absorbing energy rays between a reflective surface on a side of the first substrate and a reflective surface on the second electrode when it is assumed that the reflective surface be formed on the second electrode.

[10]

The display device according to [9], in which the reflective surface on the side of the first substrate is formed of a surface of the first electrode made of a metal material.

[11]

The display device according to [9], in which the first electrode is made of a transparent conductive material, and the reflective surface on the side of the first substrate is formed of a surface of a reflective electrode provided separately from the first electrode.

[12]

The display device according to any one of [9] to [11], in which the part between the adjacent pixels is configured to form a resonance structure for reflecting the energy rays between the reflective surface on the side of the first substrate and the reflective surface on the second electrode when it is assumed that the reflective surface be formed on the second electrode.

[13]

The display device according to [12], in which the reflective surface on the side of the first substrate in the part between the adjacent pixels is formed of a surface of a reflection plate provided on the first substrate in the part between the adjacent pixels.

[14]

An electronic device including a display device, in which the display device includes first electrodes provided for respective pixels, an insulating layer having openings respectively opposed to the first electrodes, an organic layer including a light emitting layer common to all the pixels, and a second electrode formed over an entire surface of the organic layer laminated on a first substrate, and a part corresponding to the pixel is configured to form a resonance structure for absorbing energy rays between a reflective surface on a side of the first substrate and a reflective surface on the second electrode when it is assumed that the reflective surface be formed on the second electrode.

REFERENCE SIGNS LIST

1 display device
10 display element
100 power supply unit
101 scanning unit
102 data driver
SCL scanning line
DTL data line
PS1 feeder line
PS2 second feeder line
$TR_W$ writing transistor
$TR_D$ driving transistor
$C_1$ capacitor
ELP light emitting unit
$C_{EL}$ capacitance of light emitting unit ELP
11 first substrate
12 flattening film
13 first electrode
14 reflection plate
15 insulating layer
20 organic layer
31 second electrode
32 auxiliary wiring
32' metallic material layer
33 protective film
34 adhesive layer
41 second substrate
42 color filter
43 light shielding film
212 second flattening film
213 first electrode
213' metallic material layer
214 reflection plate
311 camera body
312 interchangeable photographic lens unit (interchangeable lens)
313 grip part
314 monitor
315 viewfinder (eyepiece window)
411 glass-shaped display part
412 ear hooking part

The invention claimed is:

1. A method of manufacturing a display device including:
   first electrodes provided for respective pixels;
   an insulating layer having openings respectively opposed to the first electrodes;
   an organic layer including a light emitting layer common to all the pixels; and
   a second electrode formed over an entire surface of the organic layer laminated on a first substrate,
   the method comprising:
   a step of forming an auxiliary wiring made of a metallic material layer by
      irradiating the metallic material layer with energy rays from a side of the metallic material layer and
      selectively removing the metallic material layer by energy absorbed by a part corresponding to the pixel after the metallic material layer has been formed on an entire surface of the second electrode,
   wherein the part corresponding to the pixel is configured to form a resonance structure for absorbing the energy rays between a reflective surface on a side of the first substrate and a reflective surface formed of the metallic material layer on the second electrode.

2. The method of manufacturing a display device according to claim 1, wherein the reflective surface on the side of the first substrate is formed of a surface of the first electrode made of a metal material.

3. The method of manufacturing a display device according to claim 1, wherein the first electrode is made of a transparent conductive material, and the reflective surface on the side of the first substrate is formed of a surface of a reflective electrode provided separately from the first electrode.

4. The method of manufacturing a display device according to claim 1, wherein a part between adjacent pixels is configured to form a resonance structure for reflecting the energy rays between the reflective surface on the side of the first substrate and the reflective surface formed of the metallic material layer on the second electrode.

5. The method of manufacturing a display device according to claim 4, wherein the reflective surface on the side of the first substrate in the part between the adjacent pixels is formed of a surface of a reflection plate provided on the first substrate in the part between the adjacent pixels.

6. The method of manufacturing a display device according to claim 1, wherein the energy ray is a laser beam.

7. The method of manufacturing a display device according to claim 6, wherein the energy ray is a laser beam in an infrared region.

* * * * *